US009372945B2

(12) United States Patent  
Ellis

(10) Patent No.: US 9,372,945 B2  
(45) Date of Patent: Jun. 21, 2016

(54) METHOD AND SYSTEM FOR MODELING ANOMALOUS DENSITY ZONES IN GEOPHYSICAL EXPLORATION

(75) Inventor: Robert Ellis, Vancouver (CA)

(73) Assignee: Geosoft Inc., Toronto, Ontario (CA)

( * ) Notice: Subject to any disclaimer, the term of this patent is extended or adjusted under 35 U.S.C. 154(b) by 536 days.

(21) Appl. No.: 13/820,305

(22) PCT Filed: Aug. 31, 2011

(86) PCT No.: PCT/CA2011/050531  
§ 371 (c)(1),  
(2), (4) Date: Jul. 22, 2013

(87) PCT Pub. No.: WO2012/027848  
PCT Pub. Date: Mar. 8, 2012

(65) Prior Publication Data  
US 2013/0289958 A1    Oct. 31, 2013

Related U.S. Application Data

(60) Provisional application No. 61/380,034, filed on Sep. 3, 2010.

(51) Int. Cl.  
*G06G 7/48* (2006.01)  
*G06F 17/50* (2006.01)  
*G01V 11/00* (2006.01)

(52) U.S. Cl.  
CPC ............ *G06F 17/5009* (2013.01); *G01V 11/00* (2013.01); *G01V 2210/6165* (2013.01); *G01V 2210/6224* (2013.01); *G01V 2210/66* (2013.01)

(58) Field of Classification Search  
None  
See application file for complete search history.

(56) References Cited

U.S. PATENT DOCUMENTS

| | | | | |
|---|---|---|---|---|
| 5,798,982 A * | 8/1998 | He et al. | | 367/73 |
| 6,278,948 B1 | 8/2001 | Jorgensen et al. | | |
| 6,424,918 B1 | 7/2002 | Jorgensen et al. | | |
| 6,430,507 B1 * | 8/2002 | Jorgensen et al. | | 702/6 |
| 6,502,037 B1 | 12/2002 | Jorgensen et al. | | |
| 6,615,139 B1 | 9/2003 | Chakravarthi | | |
| 6,817,218 B1 * | 11/2004 | Kelly et al. | | 702/14 |
| 6,993,433 B2 | 1/2006 | Chavarria et al. | | |
| 7,826,973 B2 * | 11/2010 | Washbourne et al. | | 702/6 |
| 2003/0060981 A1 | 3/2003 | Routh et al. | | |

FOREIGN PATENT DOCUMENTS

WO    00/60379    10/2000

OTHER PUBLICATIONS

Li, Yongyi. "A study on applicability of density inversion in defining reservoirs." 2005 SEG Annual Meeting. Society of Exploration Geophysicists, 2005.*

(Continued)

*Primary Examiner* — Omar Fernandez Rivas  
*Assistant Examiner* — Nithya J Moll  
(74) *Attorney, Agent, or Firm* — McMillan LLP

(57) ABSTRACT

A method for modeling a subsurface anomalous density zone including the steps of forming a density model, computing a response to the density model, inverting the response to arrive at a geometric model of the anomalous density zone, and applying a sharpening function to boundary regions of the geometric model to distinguish between the anomalous density zone and a surrounding region.

30 Claims, 11 Drawing Sheets

(56) References Cited

OTHER PUBLICATIONS

Minsley, Burke J., Jonathan B. Ajo-Franklin, and Frank Dale Morgan. Non-linear constraints with application to self-potential source inversion. Massachusetts Institute of Technology. Earth Resources Laboratory, 2006.*

Portniaguine, Oleg and Zhdanov, Michael S. "3-D magnetic inversion with data compression and image focusing" Geophysics vol. 67, No. 5. pp. 1532-1541.

Li, Yaoguo and Oldenburg, Douglas W. "3-D inversion of gravity data" Geophysics vol. 63, No. 1, pp. 109-119.

* cited by examiner

METHOD AND SYSTEM FOR MODELING ANOMALOUS DENSITY ZONES IN GEOPHYSICAL EXPLORATION

CROSS-REFERENCE TO RELATED APPLICATIONS

This application claims the benefit of U.S. Provisional Application No. 61/380,034, filed Sep. 3, 2010, the entire contents of which are herein expressly incorporated by reference.

FIELD OF THE INVENTION

The invention relates to the field of geophysical exploration and earth modeling and more particularly, to methods and systems for earth modeling using improved and/or modified inversion techniques.

BACKGROUND OF THE INVENTION

Exploration for oil and/or minerals in subsurface environments has traditionally been done with seismic imaging techniques that are now well known in the art. In some applications, and particularly where there exists zones of anomalous densities or salt, seismic techniques alone fail to provide an adequate image as regions surrounding or beneath these zones are not clearly modelled. One particular example of a zone of anomalous density is a base of salt, such as that found in the Sudbury Basin in Ontario, Canada. Beneath the base of salt are significant deposits of minerals or of oil and gas, and in the case of the Sudbury basin, most notably, nickel deposits as has been shown, for example, in the Gulf of Mexico. Determining the shape of the base of salt is important in subsalt exploration. In the absence of an accurate model of these anomalous density zones, the model or image of mineral deposits or petroleum reservoirs below these zones cannot be determined with a high degree of confidence. Where seismic techniques alone fail to provide an adequate image of the base of salt, gravity response data can be used to complement the seismic data, by assisting in identifying the boundary of the base of salt, or other anomalous density zone.

As is known, the geologic component of the gravity field produced by such zones of anomalous densities, that is the component of interest, is a small fraction (approximately 2%) of the total measured gravity field. Therefore, a high level of precision and accuracy in measurement is required in order to resolve the geology with a fair degree of confidence. The advent of new and ever improving airborne gravity instrumentation, coupled with large data storage capacity and high processing speed makes it possible to develop better resolved interpretations of the airborne gravity information to thereby result in a more accurate boundary model of zones of anomalous density, such as a base of salt. It has also become standard practice in the art to model this gravity or magnetic data using inversion when complimenting the seismic, or other base data. The difficulty with relying extensively on inversion data is that the density model produced is not unique and can result in poor interpretations of the geologic boundary.

Furthermore, inversion techniques are often complex and require significant hardware processing time and resources. This is particularly important when attempting to precisely define boundaries of anomalous density zones with greater and greater precision and accuracy.

There is therefore a need in the art for a method and system that allows for more accurate and precise modelling of subsurface environments, and particularly those that include one or more regions of anomalous density zones such as regions of salt and have a base of salt below which there may be significant petroleum resources or mineral deposits. There is a further need in the art for a method and system that provides for accurate and precise modelling of subsurface environments that is less demanding on processing time and hardware resources than prior art methods and systems. There is a further need in the art to solve one or more of the above-identified problems with the prior art and for an improved method and system for earth modelling, and particularly for earth modelling of regions having one or more anomalous density zones.

SUMMARY OF THE INVENTION

According to one embodiment of the invention, there is provided a method for modeling a subsurface anomalous density zone including the steps of forming a density model, computing a response to the density model, inverting the measured gravity response to arrive at a geometric model of the anomalous density zone, and, applying a sharpening function to boundary regions of the geometric model to distinguish between the anomalous density zone and a surrounding region.

According to one aspect of the invention, the sharpening function includes an iterative inversion function that may include one or more weighting functions that are reweighted with each iteration. Preferably, the weighting functions emphasize the density of the anomalous density zone and the density of the surrounding region while suppressing transition densities between the anomalous density zone and the surrounding region.

According to another aspect of this embodiment, the sharpening step is carried out, at least in part, by applying a set of formulae of the form $S \sim ((m-m_0)^\gamma + \epsilon)^\alpha$; where $S$ is the sharpening function, $m$ is a current model, $m_0$ is a target body density, and the remaining variables are tuning parameters. Preferably, the tuning parameters are selected to emphasize the density of the anomalous density zone and the density of the surrounding region, while suppressing transition densities between the anomalous density zone and the surrounding region.

Preferably, the various embodiments of the invention are used or otherwise applied to situations where the subsurface anomalous density zone is a base of salt and the surrounding region is a sediment region, such as in subsurface geological or geophysical exploration.

According to another aspect of the invention, the step of forming a density model includes forming a density model using a velocity-density nodal relationship that preferably results in a layered density model, for example one formed by Gardner's equation: $\rho = \alpha V_p^\beta$.

According to another aspect of the invention, the response being computed is one of a gravity response and a magnetic response.

Preferably, the step of inverting includes the sub-steps of (a) creating a measure of the data misfit; (b) creating a measure of a desired model characteristic; and, (c) minimizing the model measure subject to the fitting of the data to the desired level. This may be carried out using the set of formulae.

Given $$d^{obs} = g(m) + \varepsilon$$

-continued solve $$\min_m (m - m_0)^T C_0^{-1}(m - m_0)$$

such that $$\chi^2 = \left(\frac{d^{obs} - g(m)}{\delta d_0}\right)^2 = \chi_0^2$$

where $d^{obs}$ is the observed gravity response, $\epsilon$ is the unknown error inherent in the observed response, m is the density model being recovered, $m_0$ is the target model, g( ) is the mathematical embodiment of the geophysical gravity measurement, $C_0$ is the target model covariance, $\delta d_0$ is an estimate of the true error. The second equation is minimize subject to the constraint in the third line.

According to another aspect of the invention, the step of inverting comprises a constrained inversion. Preferably, the constrained inversion includes constraints of data selected from the group comprising: response other sources, known boundary data, seismic interpretations, bathymetry, and combinations of the above. Such constraints would provide auxiliary equations, beyond the third line, to the preceding optimization problem.

According to a second embodiment of the invention, there is provided a non-transitory computer readable medium having instructions thereon for executing a computer program that when executed on a computer carries out a method for modeling a subsurface zone of anomalous density comprising the steps forming a density model, computing a response to the density model, inverting the response to arrive at a geometric model of the anomalous density zone, and, applying a sharpening function to boundary regions of the geometric model to distinguish between the anomalous density zone and a surrounding region.

According to the second embodiment, the computer readable medium may have any instructions thereon for carrying out any of the method steps as defined with respect to the first embodiment.

Accordingly, it is an object of the invention to mitigate one or more of the deficiencies of the prior art as herein identified.

BRIEF DESCRIPTION OF THE DRAWINGS

The novel features which are believed to be characteristic of the present invention, as to its structure, organization, use and method of operation, together with further objectives and advantages thereof, will be better understood from the following drawings in which a presently preferred embodiment of the invention will now be illustrated by way of example. It is expressly understood, however, that the drawings are for the purpose of illustration and description only, and are not intended as a definition of the limits of the invention. In the accompanying drawings.

DETAILED DESCRIPTION

The invention provides for an improved method and system for modeling subsurface regions of the earth, and particularly, subsurface regions having one or more zones of anomalous density. The models described throughout this description are preferably generated using voxel-based modeling, whereby subsurface regions, including those encapsulating a zone of anomalous density are modeled using an array of elements of volume that constitute a notional three-dimensional space. The three-dimensional space being modeled is thus divided into an array of discrete elements which represent this space. Data acquired from seismic, gravity and/or magnetic techniques are all converted into representative voxel data so that the data may be combined and manipulated as appropriate to arrive at the best model for a region of geophysical exploration. General methods of manipulating voxel data are generally known. Reference to datasets, various types of data and manipulations of data throughout this description are, unless otherwise noted, made with respect to voxel data or datasets. The invention contemplates the use of various other types of data as would be known in the art for creating geophysical models.

Figure 2:
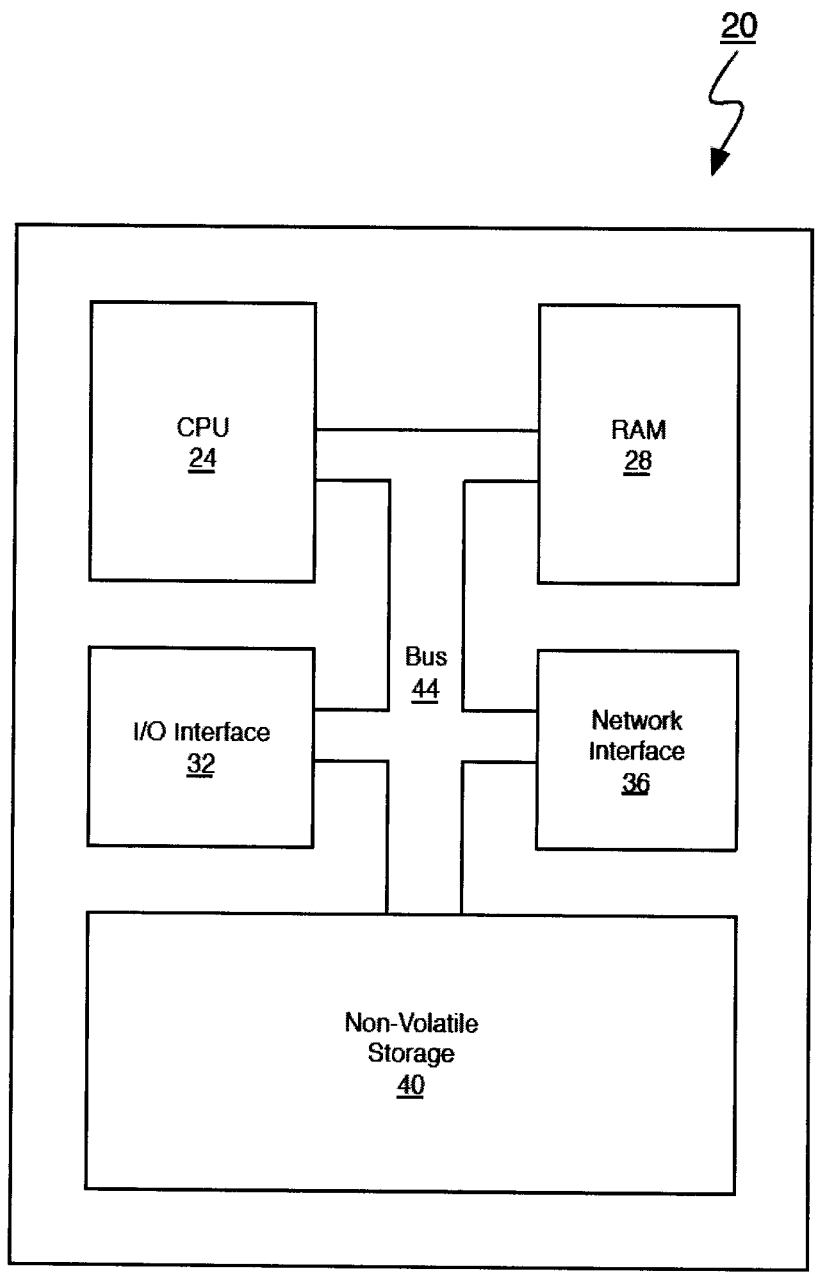
FIG. 2 is a schematic drawing of a representative computer system that may be used for carrying out the method of FIG. 1.

Various aspects of the invention may be implemented on a computer system, and particularly for carrying out the various data manipulations herein described. One such computer system is shown in FIG. 2 and may generally include a number of physical and logical components, including a central processing unit ("CPU"), random access memory ("RAM"), an input/output ("I/O") interface, a network interface, non-volatile storage, and a local bus enabling the CPU to communicate with the other components. The CPU executes an operating system, and a number of software systems, including those carrying out the method of the invention. RAM provides relatively-responsive volatile storage to the CPU. The I/O interface allows for input to be received from one or more devices, such as a keyboard, a mouse, etc., and outputs information to output devices, such as a display and/or speakers. The network interface permits communication with other systems. Non-volatile storage stores the operating system and programs, including computer-executable instructions. During operation of the computer system, the operating system, the programs and the data may be retrieved from the non-volatile storage and placed in RAM to facilitate execution. Furthermore, more than one computer system may be used. Additional computer systems may be used to carry out different steps of the method herein described.

As described above, while the invention may be used and applied to various forms of subsurface exploration and modeling, the invention is particularly useful for identifying zones of anomalous densities and more particularly, for defining the boundaries of these zones of anomalous densities. The method of the invention provides for a more accurate and precise boundary modeling of such zones using less hardware resources and faster computation time that is an improvement over the art.

Figure 1:
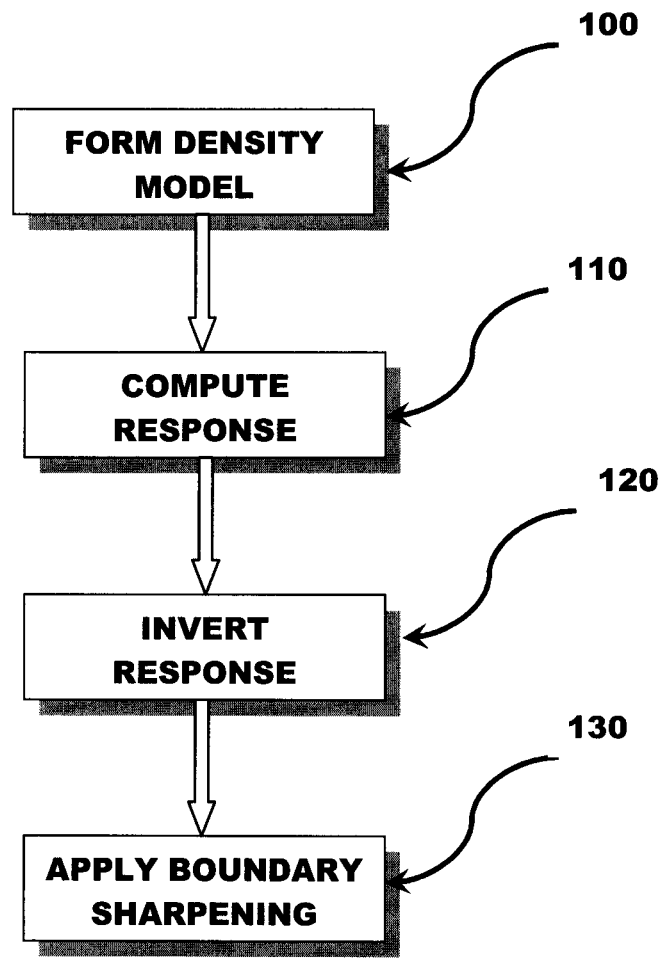
FIG. 1 is a flowchart showing one embodiment of the present invention.

Referring now to FIG. 1, the invention generally includes a method for mapping subsurface regions of the earth including the steps of forming a density model 100, computing the response 110, such as the gravity response, inverting the response 120, and applying a boundary sharpening 130 to obtain a more accurate and precise model of subsurface region. The method is particularly useful in obtaining models of regions of anomalous densities.

In step 100 of FIG. 1, a density model of a particular subsurface region is obtained. According to the preferred embodiment, the density model is calculated using a velocity density nodal relationship, such as that defined by Gardner's Equation:

$$\rho = \alpha V_p^\beta$$

Gardner's Equation defines the bulk density of a volume of space as defined from the P-wave velocity obtained from seismic data and empirically derived constants for a particular geology. Once a density model of a particular region is derived from this calculation, where a zone of anomalous density exists, it will be evident that some zone having a different density in the density model exists. However, as in prior art methods, the boundary between the zone of anomalous density and the surrounding regions cannot be clearly defined merely from the seismic data collected and converted into a model using the equation above. Furthermore, as is well known, Gardner's Equation does not fit well with certain compounds, including salt. This is particularly problematic where the zone of anomalous density is a base of salt, as is quite common in mineral exploration. Accordingly, subsalt regions and regions in the immediate vicinity of any base of salt are not clearly delineated from the density model derived from Gardner's Equation.

The resultant density model thus derived is a layered density model produced from layered velocities. The earth model will thus comprise a number of voxels occupying the space being modeled, each having associated therewith a density.

As will be appreciated by those skilled in the art, other methods for obtaining a density model may be used in step 100 of the invention. Such alternate methods may include empirically derived methods and theoretically derived methods and would be known to a person skilled in the art. This step provides for a crude density model of a subsurface region, that may identify possible anomalous density zones, from which more detailed modeling may be required to obtain a more accurate and precise model of the subsurface region.

According to step 120 of FIG. 1, the response of the density model is then obtained. In the preferred embodiment, the gravity response is used, but it is also conceivable that a magnetic or tensor response can be applied without departing from the invention. Gravity response can be computed and/or measured in a number of ways known in the art. According to the preferred embodiment, the gravity response is determined from obtained airborne gravity information. Such methods and instruments for obtaining this information are known in the prior art and are only described in general detail. Generally, all airborne data is first submitted to the standard despiking, initial time based noise filtering, drift correction and leveling. After these steps are applied, gravity data reduction takes place. Specifically inherent to gravity data reduction are the latitude effect, free air, Bourguer and terrain corrections, and earth curvature corrections. The effects of the Earth's rotation are accounted for in the tidal and Eotvos corrections. Furthermore, vertical and horizontal acceleration corrections are necessary as the airborne gravity data is obtained from a moving platform. Once the airborne gravity data is obtained and all corrections have been made the data is inverted to obtain a zone model.

According to step 130 of FIG. 1, the gravity response is then inverted to obtain a mapping and model of an identified anomalous density zone, such as a base of salt. For clarity, references to an anomalous density zone and a base of salt are used interchangeable throughout the description. One skilled in the art would appreciate that the invention applies to any areas of anomalous density, but is described with reference to that found in most common applications of the invention, and that is, where such zone is a base of salt with possible subsalt mineral areas. In addition, while step 130 describes an inversion of the gravity response, it will be appreciated that where other types of data are obtained in step 120, such as magnetic data, the inversion will be with respect to such other types of data. Inversion, and particularly gravity inversion, is either carried out in an unconstrained manner or in a cooperative manner, where the inversion is constrained by geological and geophysical aspects.

As would be known to one skilled in the art, unconstrained inversion produces a model of the anomalous density zone that is the smoothest model fitting the gravity data. That is, the boundaries of the model, rather than being a true reflection of the boundary is instead a best fit model. Furthermore, there are many models that will have the same response and thus, direct, unconstrained inversion produces a model of the anomalous density zone that is not unique.

In carrying out unconstrained inversion, a model is computed based on gravity data. There are many models which have the same response, and therefore, the model is not unique. There is always noise associated with the measured data and therefore the data is fit to an appropriate level. In order to solve this inverse problem, the following steps are carried out:

(a) create a measure of the data misfit; (b) create a measure of the desired model characteristic, e.g., a measure of smoothness and/or deviation from a prior model; and, (c) minimize the model measure subject to the fitting of the data to the desired level. Generally, the inversion produces a least squares fit of the dataset. This method may be implemented, for example, with the following set of calculations:

Given $$d^{obs} = g(m) + \varepsilon$$

solve $$\min_m (m - m_0)^T C_0^{-1}(m - m_0)$$

such that $$\chi^2 = \left(\frac{d^{obs} - g(m)}{\delta d_0}\right)^2 = \chi_0^2$$

The first equation mathematically defines the geophysical forward problem: a gravity model, m, yields data, d, including a noise term, $\varepsilon$. The second equation indicates that a model m should be found which minimizes a model characteristic encapsulated in C0. The third equation indicates that the data from model, m, should satisfy a suitable misfit criterion.

According to an optional variation of the invention, a cooperative and/or constrained inversion process may be used, whereby constraints are introduced into the gravity (or magnetic or other) inversion process to refine the best fit result obtained by an unconstrained inversion and arrive at a model being more reflective of the actual boundary of the anomalous density zones. These constraints may be geological and/or geophysical. In one example, the constraints are determined from one of, or a combination of, seismic interpretations and bathymetry analysis. In this approach, the contact surfaces of geologic domains is used to facilitate changes in physical properties between domains, where consistent with the geophysical data. Inversion data from other sources, such as magnetic data, may further be used to enhance the gravity inversion by incorporating changes in magnetic susceptibility to facilitate changes in density. That is, a cooperative method using multiple sources of data that are inverted may be used, along with data constraints based on known geological and geophysical parameters.

Geological constraints can be introduced in a number of ways. For example, contact surfaces of geologic domains may be used to facilitate changes in physical properties between domains, where consistent with the geophysical data. One example of this, is where the boundary layer of the top of salt is known. Accordingly, a geological constraint on the base of salt would be inferred to be that of the top of salt. A further, more detailed example is provided below. Once the gravity (or other) inversion is computed, there will have be a derived model of the zone of anomalous density, such as a base of salt. While inversion produces a rough estimate of the base of salt, or other anomalous density zone, the boundary derived from such an inversion, is typically unclear and no accommodation is made for transition densities, that may occupy a significant geological space.

According to the preferred embodiment of the invention, step 140 of FIG. 1 further includes applying a boundary sharpening process to the boundary obtained from the inversion-derived model of step 130. Preferably, a boundary sharpening process is selected to emphasize the salt and sediment densities while suppressing the transition densities. This allows for a clearer distinction to be made between the base of salt (or other anomalous density zone) and the surrounding sediment. More preferably, the boundary sharpening is achieved using an Iterative Reweighed Inversion method proposed by the invention in which weighting functions are designed to emphasize the salt and sediment densities while suppressing the transition densities. More specifically, densities known to be either salt or sediment are weighted more heavily in subsequent iterations of the inversion process. The invention is not restricted to any particular number of iterations and these will be dependent on the resources available.

Sharpening is carried using a set of formulae of the form:

$$S \sim ((m-m_0)^\gamma + \epsilon)^\alpha$$

where S is the sharpening function, in is the current model, $m_0$ is the target body density, and the remaining variables are tuning parameters. The tuning parameters account for the sensitivity in the density. Accordingly, in implementing the sharpening step of the invention, preferably a plurality of passes are carried out that iteratively suppress layers of transition densities between a zone of anomalous density and the density of a surrounding region. By suppressing such transition densities, a more clearly defined border of the anomalous density zone may be arrived at.

EXAMPLE

Figure 3:
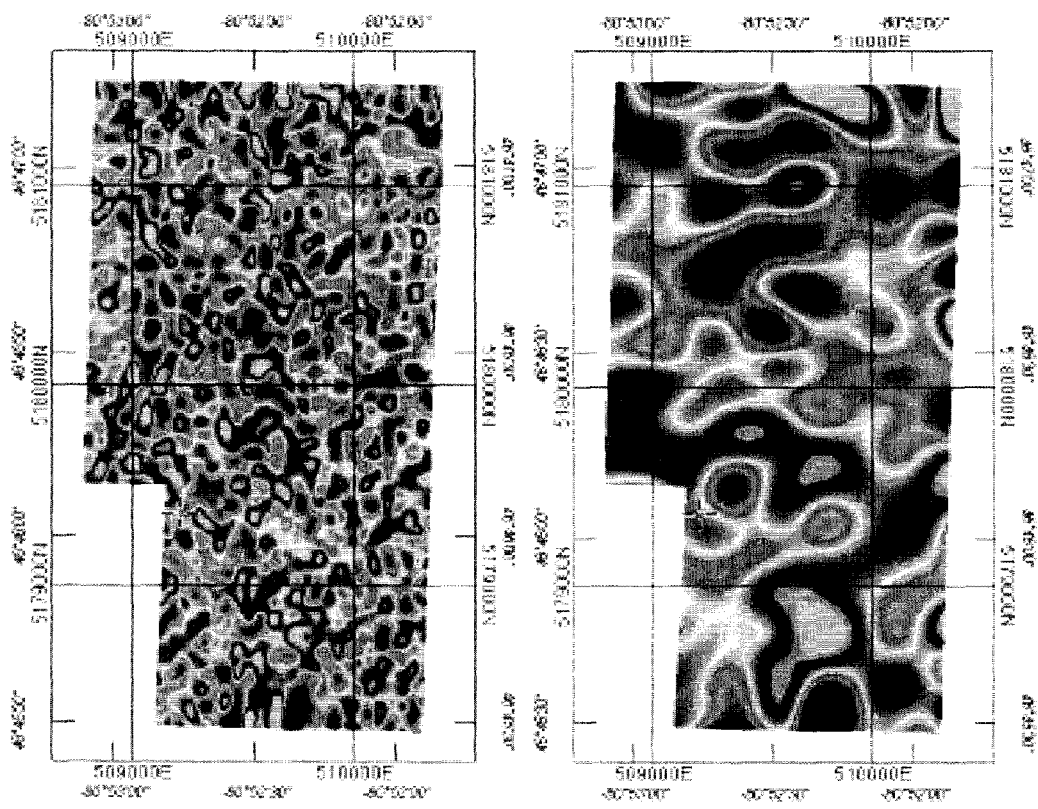
FIG. 3 shows airborne acquired gravity data with a low pass filter being applied.
Figure 4:
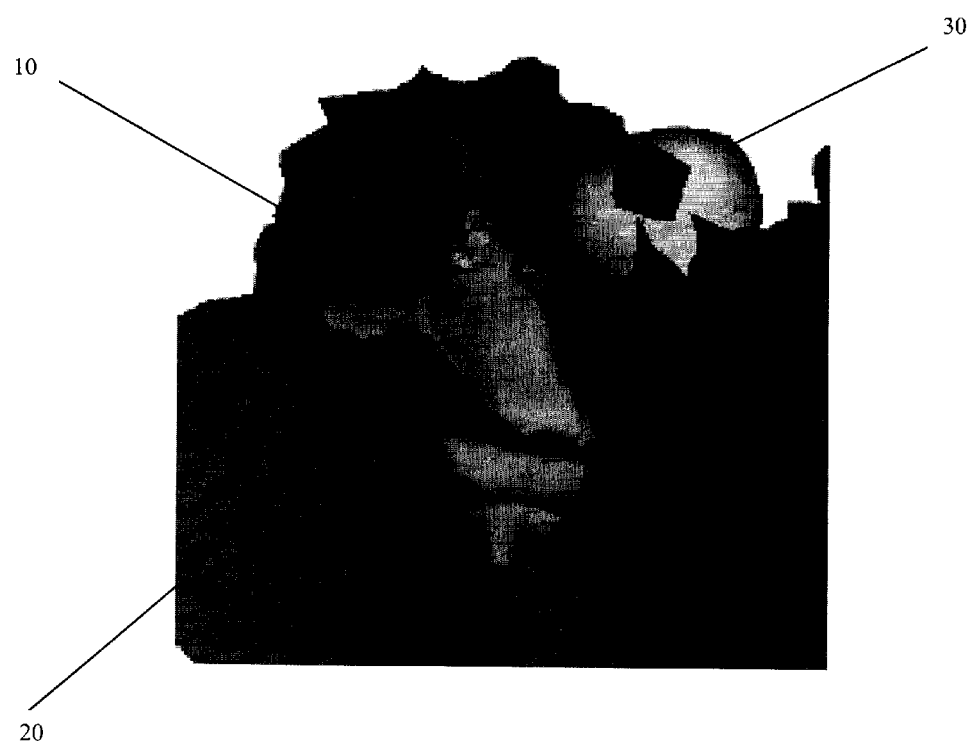
FIG. 4 shows an unconstrained inversion of the gravity data of FIG. 3.

The invention was tested at a portion of the Nickel Ramp Deposit of the Sudbury Basin in Ontario, Canada. FIG. 3 shows airborne acquired gravity data with a low pass filter at 375 m having been applied. FIG. 4 shows an unconstrained inversion of the gravity data of FIG. 3 using traditional regularized inversion methods. The Nickel Ramp Deposit 10, the sub layer Norite 20 and a contrast density isosurface 30 of +0.6 g/cm$^3$ are shown at varying gray scales. There is little correlation between the mineralization and the recovered density. This is because the unconstrained gravity inversion data is merely the smoothest model that fits the gravity data. It will be appreciated by those skilled in the art that this inversion model would most likely lead an explorationist to a poor interpretation.

Figure 5:
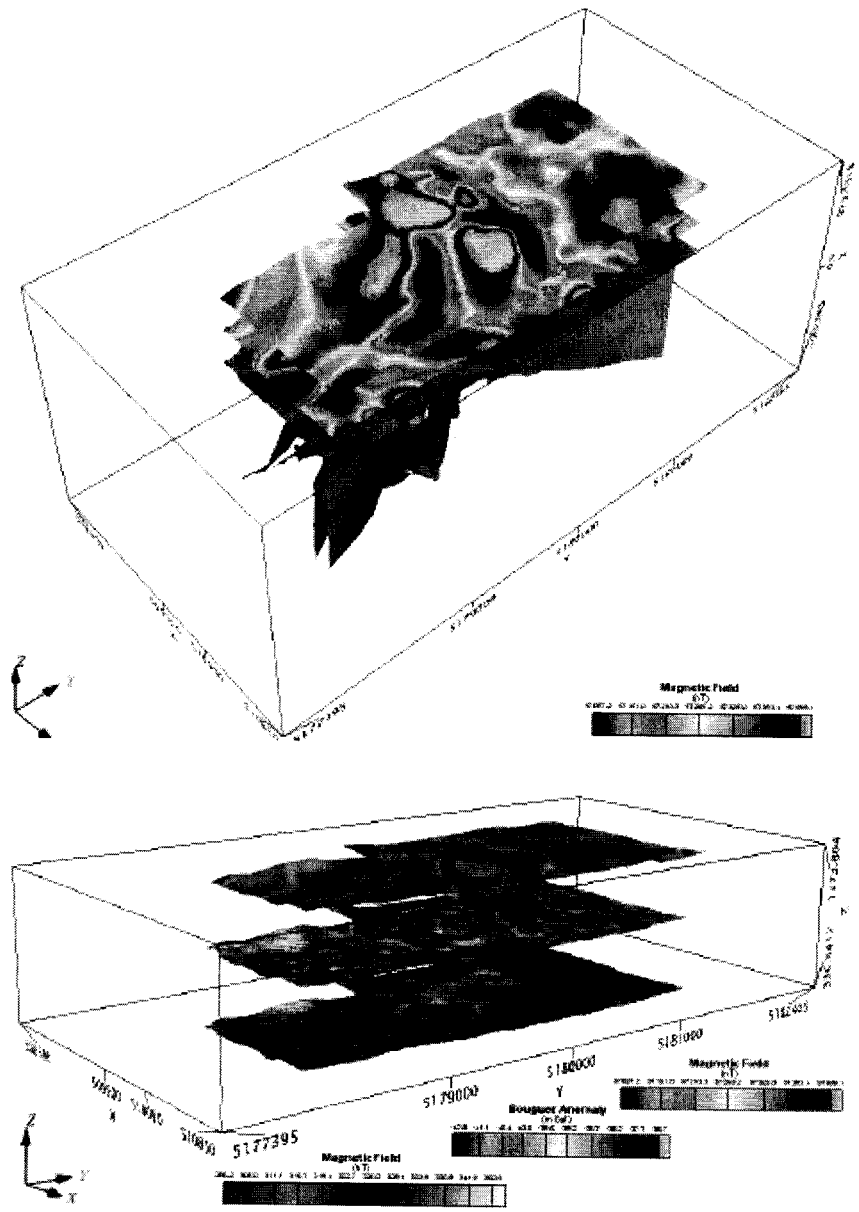
FIG. 5 shows magnetic data superimposed on the gravity data of FIG. 3.
Figure 6:
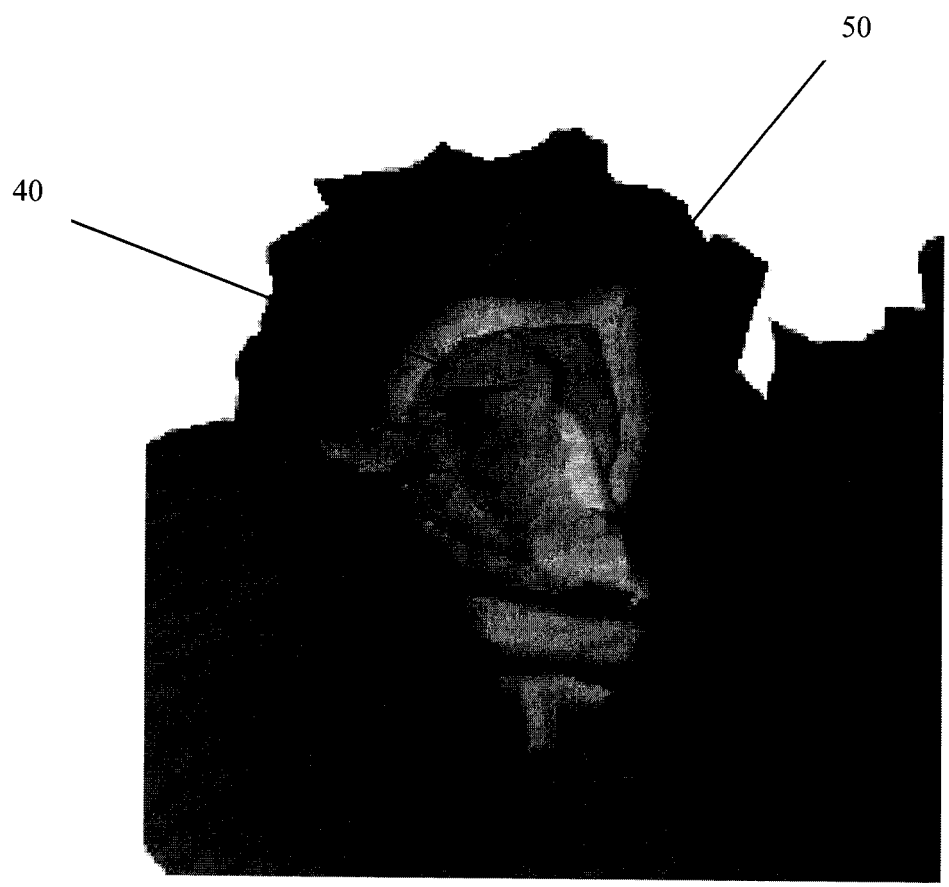
FIG. 6 shows a gravity inversion model obtained by the cooperative inversion of the data of FIG. 3 and FIG. 5.

FIG. 5 shows magnetic data superimposed on the gravity data of FIG. 3. By applying the constraints and using magnetic data inversion to compliment the gravity data inversion, the resultant constrained inversion gravity model is obtained and shown in FIG. 6. In this example, the magnetic model recovered from the magnetic data inversion is used as the basis for a weighting function used in the gravity inversion. The magnetic based weighting function causes the structure of the magnetic model to be imprinted into the gravity model through the inversion, where such magnetic structure is consistent with the gravity data. Two density contrast isosurfaces are shown at +1.8 g/cm$^3$ 40 and at +1.0 g/cm$^3$ 50. Comparing this to the unconstrained model of FIG. 4, it will be apparent that the constrained density anomaly is significantly more consistent with densities suggested by the location of the nickel mineralization, while the fit to the observed gravity data remains the same. In particular, the constrained density anomaly no longer unrealistically straddles the norite contact, and it has a more plausible density contrast amplitude for this type of mineralization. The latter is a consequence of the anomaly being forced deeper by the auxiliary information. This result would significantly improve the interpretation as achieved from this cooperative inversion compared to that made from the unconstrained inversion of FIG. 4.

Figure 7:
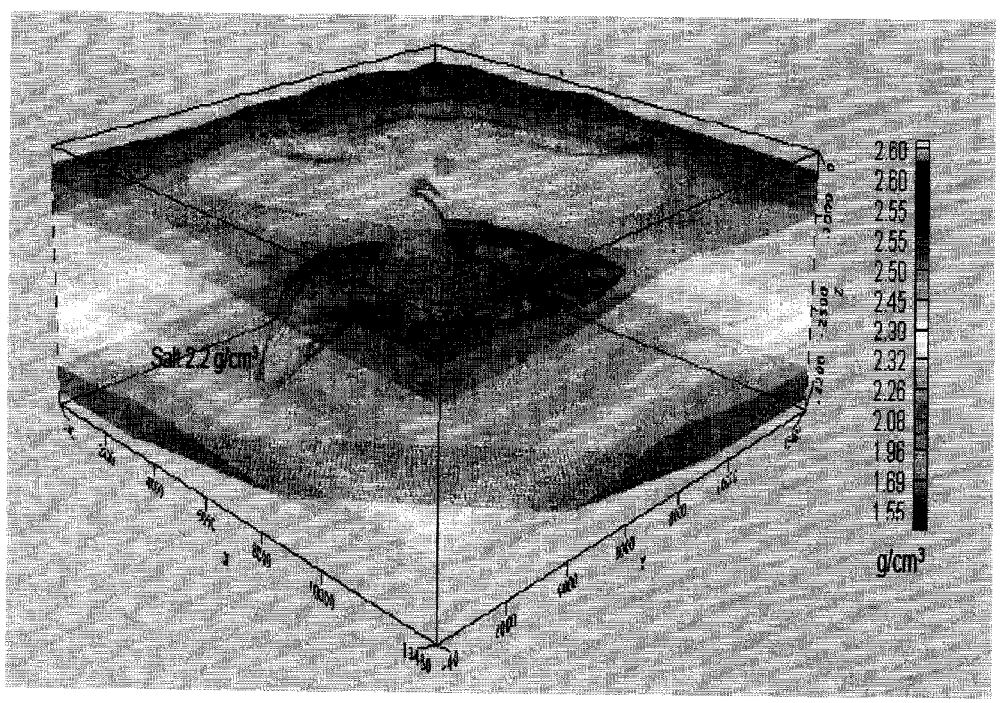
FIG. 7 shows a representative original gravity model.
Figure 8:
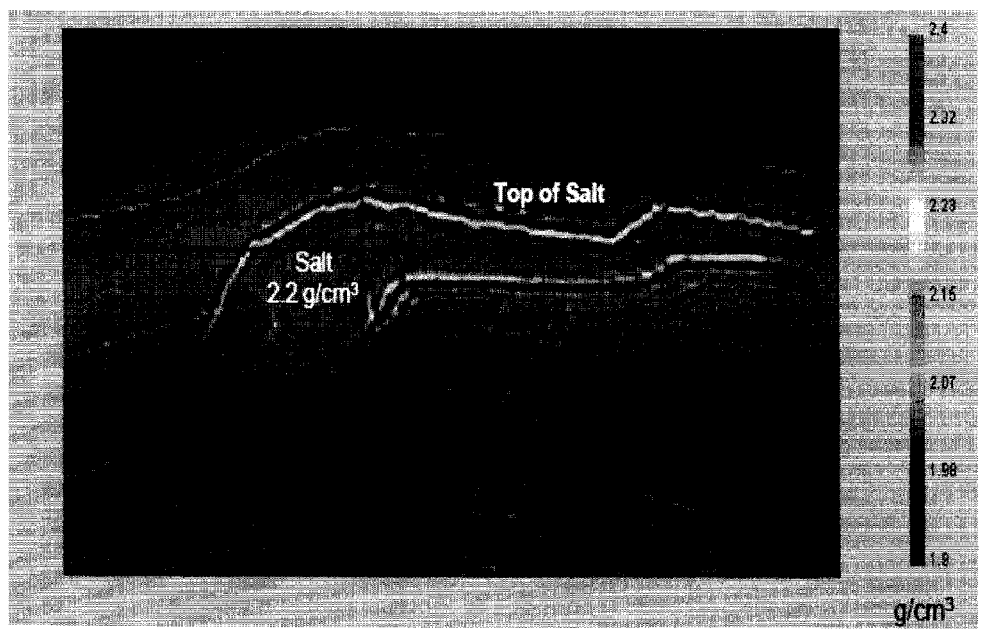
FIG. 8 shows a slice taken through the model of FIG. 5 at 6000 E.
Figure 9:
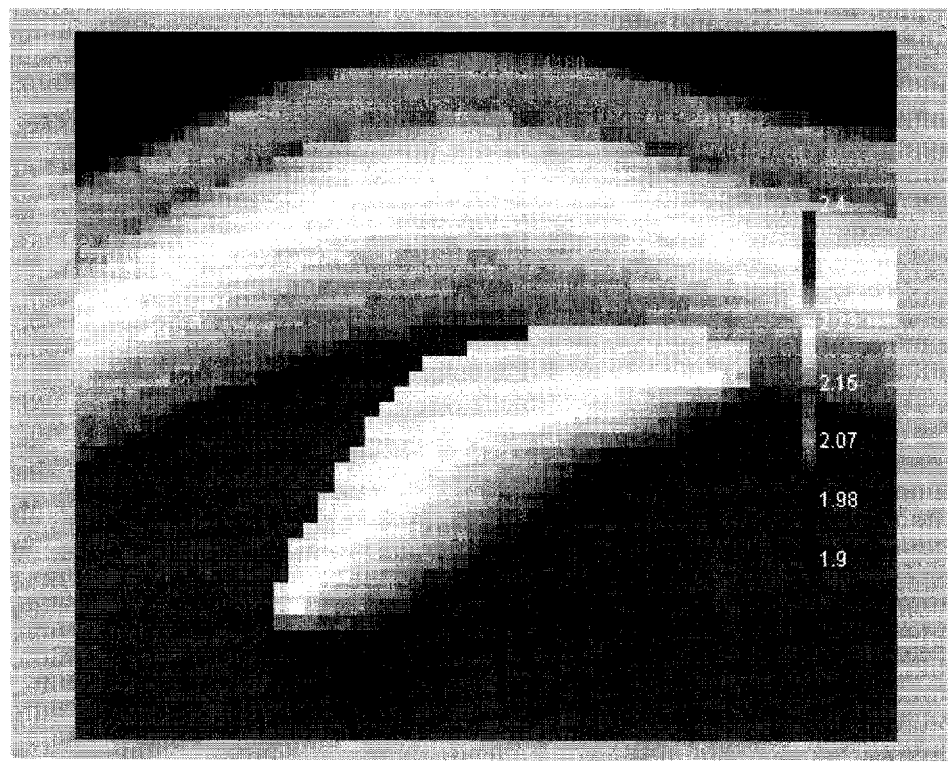
FIG. 9 shows a first sharpening iteration slice taken through the model of FIG. 5 at 4400 E.
Figure 10:
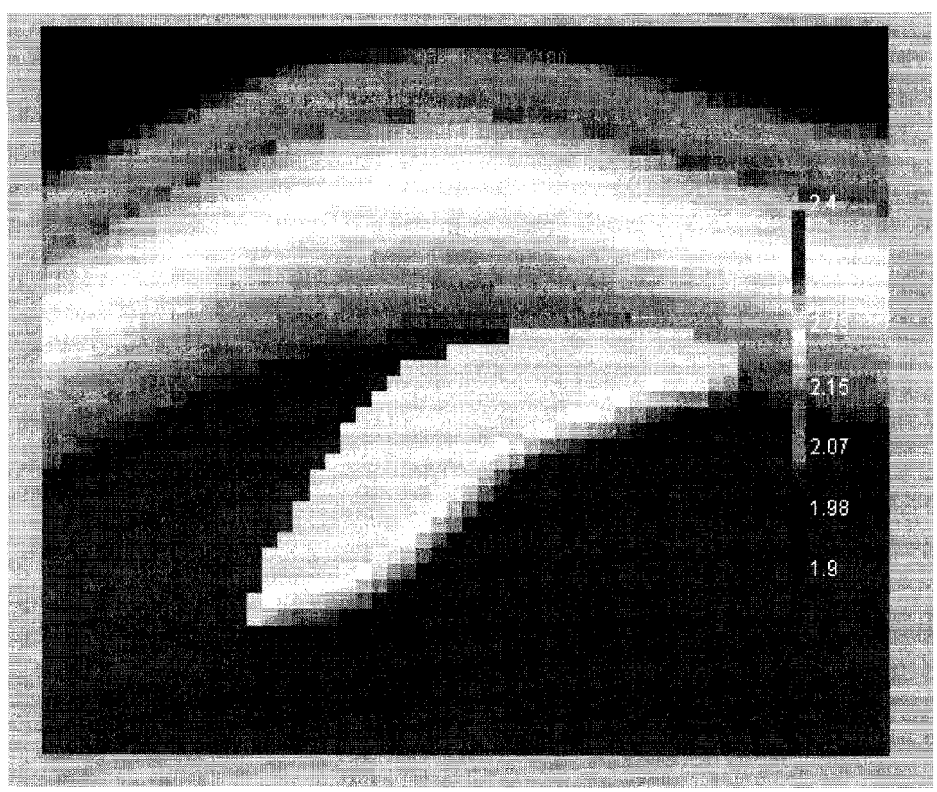
FIG. 10 shows a second sharpening iteration slice taken through the model of FIG. 5 at 4400 E.
Figure 11:
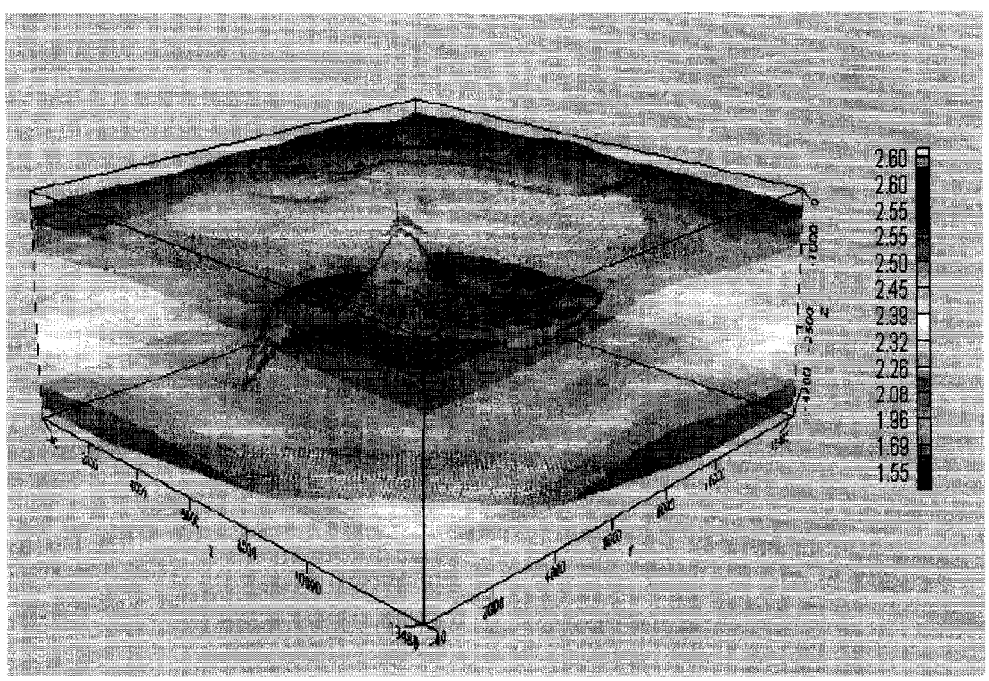
FIG. 11 shows the resultant iterative weighted gravity inversion model obtained in accordance with one example in which the invention of FIG. 1 is applied.

FIG. 7 shows a slice taken through the recovered inversion density model at 6000 E. The base of salt 100 has been imaged with the top of salt being used as a constraint on the inversion and sharpening used to enhance the salt-sediment boundary. Boundary sharpening is achieved using the iterative reweighting inversion method of the invention. A slice through the first iteration showing an unsharpened inversion density model at 4400 E is shown in FIG. 8. A slice through the second iteration showing a sharpened inversion density model at 4400 E is shown in FIG. 9. The resultant iterative weighted inversion model is shown in FIG. 10. As will be apparent, the iterative weighted inversion model produces a more accurate estimate of the base of salt and has a gravity response that agrees with the true gravity response. It will be appreciated that small scale features of the base of salt cannot be resolved with gravity data alone.

Accordingly, various methods of modifying gravity inversion data for use in geophysical exploration have been disclosed. It will be appreciated by those skilled in the art that the invention is not limited to the precise forms as disclosed, nor is it limited only to gravity data, but rather the descriptions provided herein are representative of preferred embodiments for carrying out the general methods according to the invention.

The above-described embodiments are intended to be examples of the present invention and alterations and modifications may be effected thereto, by those of skill in the art, without departing from the scope of the invention that is defined solely by the claims appended hereto.

The invention claimed is:
1. A computer-implemented method for modeling a subsurface anomalous density zone comprising:
   i. forming a density model;
   ii. computing a response to said density model;
   iii. inverting said response to arrive at a geometric model of the anomalous density zone;
   iv. applying a sharpening function to boundary regions of said geometric model to distinguish between the anomalous density zone and a surrounding region; and
   wherein said step of inverting comprises the sub-steps of (a) creating a measure of data misfit; (b) creating a measure of a desired model characteristic; and, (c) minimizing the model measure subject to the fitting of the data to the desired level; wherein said step of inverting is carried out using the set of formulae:

Given
$$d^{obs} = g(m) + \varepsilon$$
solve
$$\min_{m}(m-m_0)^T C_0^{-1}(m-m_0)$$
such that
$$\chi^2 = \left(\frac{d^{obs} - g(m)}{\delta d_0}\right)^2 = \chi_0^2$$

where $d^{obs}$ is the observed gravity response, $\varepsilon$ is the unknown error inherent in an observed response, m is a density model being recovered, $m_0$ is a target model, g( ) is a mathematical embodiment of the geophysical gravity measurement, T is a transpose operator, $\chi^2$ is a direct measure of the data misfit, $\chi_0^2$ is the misfit of target model, $C_0$ is a target model covariance, and $\delta d_0$ is an estimate of the true error.

2. The computer-implemented method according to claim 1, wherein said sharpening function comprises an iterative inversion function.

3. The computer-implemented method according to claim 2, wherein said iterative inversion function includes one or more weighting functions that are reweighted with each iteration.

4. The computer-implemented method according to claim 3, wherein said weighting functions emphasize the density of the anomalous density zone and the density of the surrounding region while suppressing transition densities between the anomalous density zone and the surrounding region.

5. The computer-implemented method according to claim 1, wherein said sharpening step comprises applying a set of formulae of the form $S \sim ((m-m_0)^\gamma + \epsilon \alpha)$, where S is the sharpening function, m is a current model, $m_0$ is a target body density, and the remaining variables are tuning parameters.

6. The computer-implemented method according to claim 5, wherein said tuning parameters are selected to emphasize the density of the anomalous density zone and the density of the surrounding region, while suppressing transition densities between the anomalous density zone and the surrounding region.

7. The computer-implemented method according to claim 1, wherein the subsurface anomalous density zone is a base of salt and the surrounding region is a sediment region.

8. The computer-implemented method according to claim 1, wherein said step of forming a density model includes forming a density model using a velocity-density nodal relationship.

9. The computer-implemented method according to claim 8, wherein said density model is a layered density model.

10. The computer-implemented method according to claim 8, wherein said density model is formed from the equation: $\rho = \alpha V_p^\beta$, where $\rho$ is a bulk density given in g/cm$^3$; $\alpha$ and $\beta$ are emperically derived constants; and $V_p$ is a P-wave velocity given in ft/s.

11. The computer-implemented method according to claim 1, wherein said response is one of a gravity response and a magnetic response.

12. The computer-implemented method according to claim 1, wherein said step of inverting comprises an unconstrained inversion.

13. The computer-implemented method according to claim 1, wherein said step of inverting comprises a constrained inversion.

14. The computer-implemented method according to claim 13, wherein said constrained inversion includes constraints from data selected from the group comprising: response other sources, known boundary data, seismic interpretations, bathymetry, and combinations of the above.

15. A non-transitory computer readable medium having instructions thereon for executing a computer program that when executed on a computer carries out a method for modeling a subsurface zone of anomalous density comprising the steps of
   i. forming a density model;
   ii. computing a response to said density model;
   iii. inverting said response to arrive at a geometric model of the anomalous density zone; and,
   iv. applying a sharpening function to boundary regions of said geometric model to distinguish between the anomalous density zone and a surrounding region; said sharpening step comprises applying a set of formulae of the form $S \sim ((m-m_0)^\gamma + \epsilon)^\alpha$; where S is the sharpening function, m is a current model, $m_0$ is a target body density, and the remaining variables are tuning parameters.

16. The non-transitory computer readable medium according to claim 15, wherein said sharpening function comprises an iterative inversion function.

17. The non-transitory computer readable medium according to claim 16, wherein said iterative inversion function includes one or more weighting functions that are reweighted with each iteration.

18. The non-transitory computer readable medium according to claim 17, wherein said weighting functions emphasize the density of the anomalous density zone and the density of the surrounding region while suppressing transition densities between the anomalous density zone and the surrounding region.

19. The non-transitory computer readable medium according to claim 15, wherein said tuning parameters are selected to emphasize the density of the anomalous density zone and the density of the surrounding region, while suppressing transition densities between the anomalous density zone and the surrounding region.

20. The non-transitory computer readable medium according to claim 15, wherein the subsurface anomalous density zone is a base of salt and the surrounding region is a sediment region.

21. The non-transitory computer readable medium according to claim 15, wherein said step of forming a density model includes forming a density model using a velocity-density nodal relationship.

22. The non-transitory computer readable medium according to claim 21, wherein said density model is a layered density model.

23. The non-transitory computer readable medium according to claim 21, wherein said density model is formed from the equation: $\rho=\alpha V_p^\beta$, where $\rho$ is a bulk density given in g/cm$^3$; $\alpha$ and $\beta$ are emperically derived constants; and $V_p$ is a P-wave velocity given in ft/s.

24. The non-transitory computer readable medium according to claim 15, wherein said response is one of a gravity response and a magnetic response.

25. The non-transitory computer readable medium according to claim 15, wherein said step of inverting comprises the sub-steps of (a) creating a measure of data misfit; (b) creating a measure of a desired model characteristic; and, (c) minimizing the model measure subject to the fitting of the data to the desired level.

26. The non-transitory computer readable medium according to claim 25, wherein said step of inverting is carried out using the set of formulae:

Given
$$d^{obs} = g(m) + \varepsilon$$
solve
$$\min_m (m-m_0)^T C_0^{-1}(m-m_0)$$
such that
$$\chi^2 = \left(\frac{d^{obs}-g(m)}{\delta d_0}\right)^2 = \chi_0^2$$

where $d^{obs}$ is the observed gravity response, is the unknown error inherent in an observed response, m is a density model being recovered, $m_0$ is a target model, g( ) is a mathematical embodiment of the geophysical gravity measurement, T is a transpose operator, $\chi^2$ is a direct measure of the data misfit, $\chi_0^2$ is the misfit of target model, $C_0$ is a target model covariance, and $\delta d_0$ is an estimate of the true error.

27. The non-transitory computer readable medium according to claim 15, wherein said step of inverting comprises an unconstrained inversion.

28. The non-transitory computer readable medium according to claim 15, wherein said step of inverting comprises a constrained inversion.

29. The non-transitory computer readable medium according to claim 28, wherein said constrained inversion includes constraints from data selected from the group comprising: response other sources, known boundary data, seismic interpretations, bathymetry, and combinations of the above.

30. A computer-implemented method for modeling a subsurface anomalous density zone comprising:
  i. forming a density model;
  ii. computing a response to said density model;
  iii. inverting said response to arrive at a geometric model of the anomalous density zone; and,
  iv. applying a sharpening function to boundary regions of said geometric model to distinguish between the anomalous density zone and a surrounding region; said sharpening step comprises applying a set of formulae of the form $S \sim ((m-m_0)^\gamma + \epsilon)^\alpha$; where S is the sharpening function, m is a current model, $m_0$ is a target body density, and the remaining variables are tuning parameters.

* * * * *